United States Patent
Nakayama et al.

(10) Patent No.: US 8,071,877 B2
(45) Date of Patent: Dec. 6, 2011

(54) BOX FOR ACCOMMODATING ELECTRIC CONNECTION BOX

(75) Inventors: Makoto Nakayama, Kakegawa (JP); Shinichi Hamaguchi, Kakegawa (JP); Yutaka Sekiuchi, Yokohama (JP)

(73) Assignee: Yazaki Corporation, Tokyo (JP)

( * ) Notice: Subject to any disclaimer, the term of this patent is extended or adjusted under 35 U.S.C. 154(b) by 223 days.

(21) Appl. No.: 12/412,425

(22) Filed: Mar. 27, 2009

(65) Prior Publication Data

US 2009/0242267 A1   Oct. 1, 2009

(30) Foreign Application Priority Data

Mar. 28, 2008   (JP) .................................. 2008-087729

(51) Int. Cl.
H05K 5/02   (2006.01)
(52) U.S. Cl. .............. 174/50; 174/53; 174/57; 439/535; 361/600
(58) Field of Classification Search .................... 174/50, 174/53, 57, 58, 60; 220/4.02, 3.6, 3.8; 439/535; 361/600, 800, 818; 248/906
See application file for complete search history.

(56) References Cited

U.S. PATENT DOCUMENTS 7,459,631 B2 * 12/2008 Nakayama et al. ............. 174/50

FOREIGN PATENT DOCUMENTS

JP   2004-140956 A   5/2004

* cited by examiner

*Primary Examiner* — Dhirubhai R Patel
(74) *Attorney, Agent, or Firm* — Sughrue Mion, PLLC

(57) ABSTRACT

A box for accommodating an electric connection box is provided. The box includes a lower cover which has a plurality of walls for surrounding a space to accommodate the electric connection box toward a predetermined insertion direction, and an upper cover. The plurality of walls includes: a first wall which extends along the insertion direction; second and third walls which extend from the first wall in a direction intersecting the insertion direction and faces each other; a fourth wall which extends from the first, second and third walls at a deep side of the insertion direction so as to support the electric connection box; and a fifth wall which extends from the second and third walls along the insertion direction, and is substantially parallel to the first wall so as to press-sandwich the electric connection box by the first and fifth walls.

5 Claims, 15 Drawing Sheets

BOX FOR ACCOMMODATING ELECTRIC CONNECTION BOX

BACKGROUND OF THE INVENTION

1. Technical Field

The present invention relates to a box for accommodating an electric connection box mainly mounted to a vehicle.

2. Background Art

An engine room of an automobile is mounted with an electric connection box which accommodates a circuit board provided with an electronic component or an electric component and is used as a connection branch point of a wire harness.

For example, as described in JP-A-2004-140956, the electric connection box has a configuration in which a main cover for accommodating an electronic circuit board provided with an electronic component and an electric component overlaps with a lower cover and an upper cover for protecting the electronic component and the electric component is mounted to the main cover and the lower cover. The electric connection box is vertically mounted to the inside of the engine room.

In the electric connection box, the upper end of the lower cover in a vertical direction is provided with a positioning structure for fixing the upper cover. The upper end of the upper cover in a vertical direction is provided with a water-resistant member for closing a gap from the lower cover. The lower cover is directly attached to a vehicle body so as to be fixed thereto.

Although the electronic circuit board provided with the electronic component or the electric component is accommodated in the cover, it is necessary to prevent the electronic component or the electric component from being separated from the electronic circuit board due to a vibration in a vehicle running state. Accordingly, it is important to design a structure which prevents a rattling movement of the main cover provided with the electronic circuit board in the inside of the lower cover or the upper cover.

SUMMARY OF THE INVENTION

The present invention is contrived in consideration of the above-described circumstances, and an object of the invention is to provide a box for accommodating an electric connection box capable of simply preventing an electric connection box containing an electronic circuit board and the like from rattling in the inside of a cover due to a vibration of a vehicle.

In order to achieve the above-described object, according to an aspect of the invention, there is provided a box for accommodating an electric connection box, including: a lower cover which comprises a plurality of walls for surrounding a space to accommodate the electric connection box toward a predetermined insertion direction, the plurality of walls including: a first wall which extends along the insertion direction; second and third walls which extend from the first wall in a direction intersecting the insertion direction and faces each other; a fourth wall which extends from the first, second and third walls at a deep side of the insertion direction so as to support the electric connection box; and a fifth wall which extends from the second and third walls along the insertion direction, and is substantially parallel to the first wall so as to sandwich the electric connection box by the first and fifth walls.

According to the box for accommodating the electric connection box of the invention, it is possible to simply prevent the electric connection box containing the electronic circuit board and the like from rattling in the inside of the cover due to the vibration of the vehicle.

BRIEF DESCRIPTION OF THE DRAWINGS

FIG. 10A is a perspective view when viewed from the front side thereof, FIG. 10B is a perspective view when viewed from the rear side thereof, and FIG. 10C is a sectional view taken along the arrow IIIc-IIIc of FIG. 10A;

DETAILED DESCRIPTION OF THE PREFERRED EMBODIMENTS

Hereinafter, exemplary embodiments of the invention will be described with reference to the accompanying drawings.

First Embodiment

Figure 1:
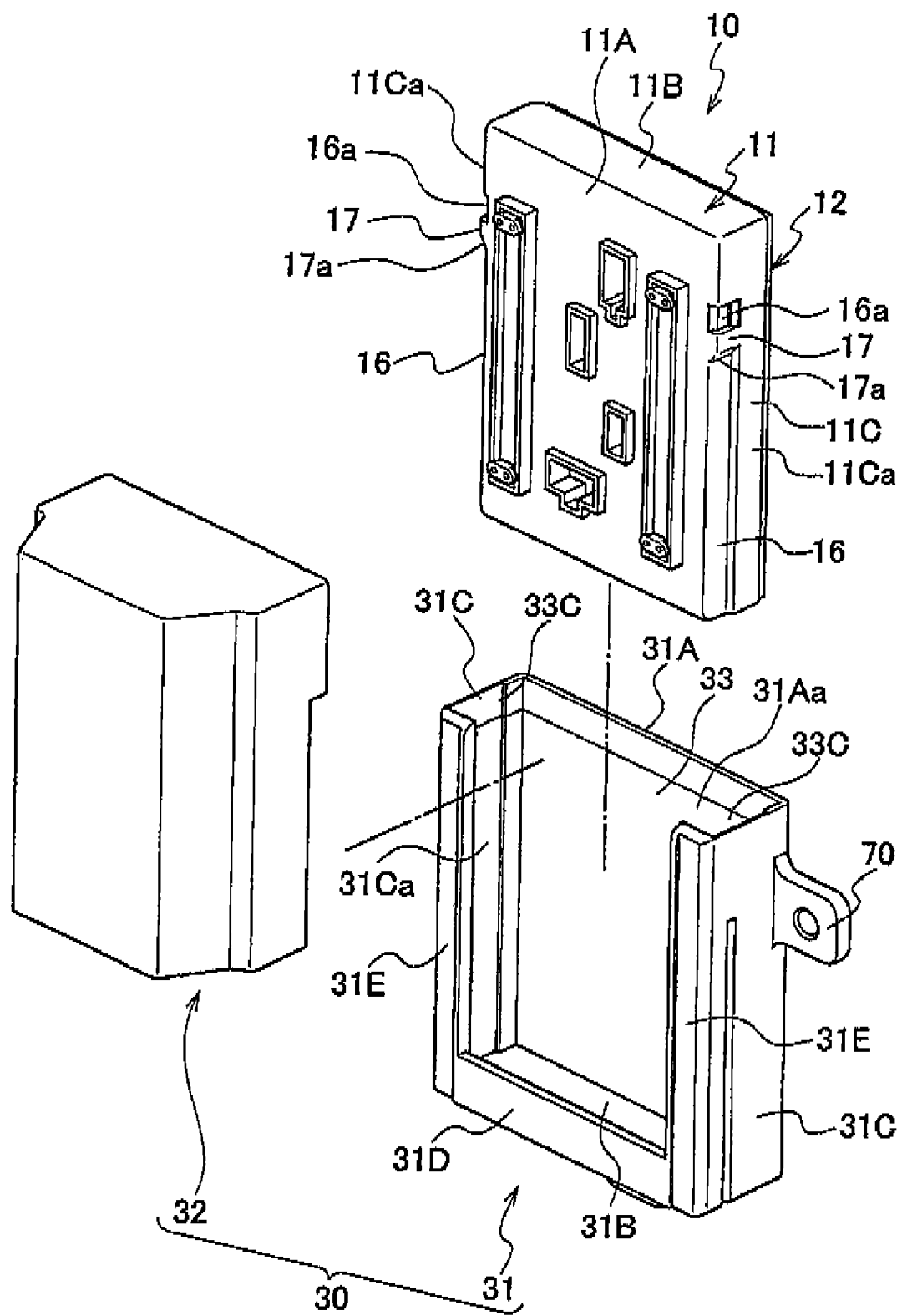
FIG. 1 is a perspective view showing a relationship between an electric connection box and an accommodation box according to a first embodiment of the invention.
Figure 2:
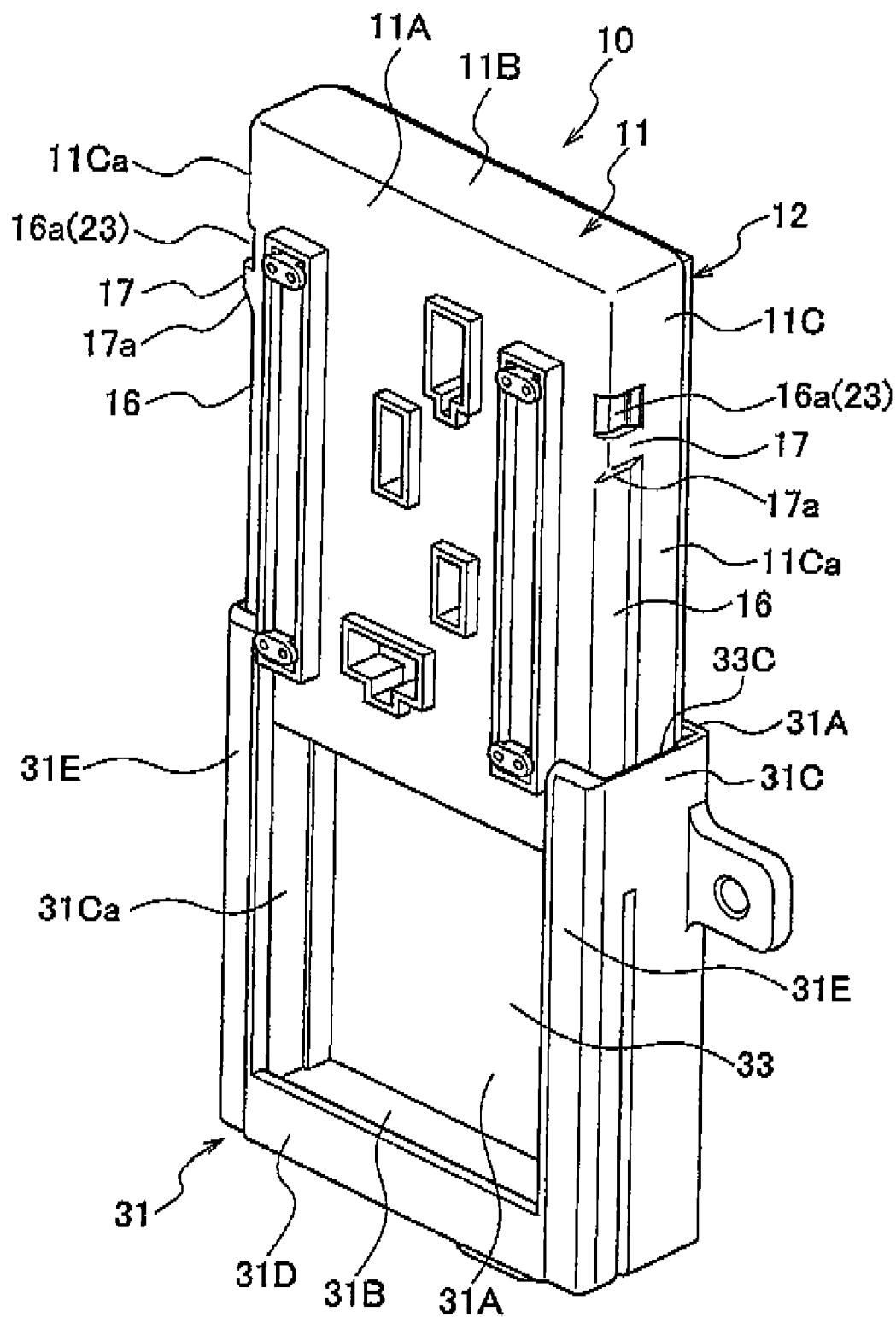
FIG. 2 is a perspective view showing the state where the electric connection box is being inserted into a lower cover of the accommodation box.
Figure 3:
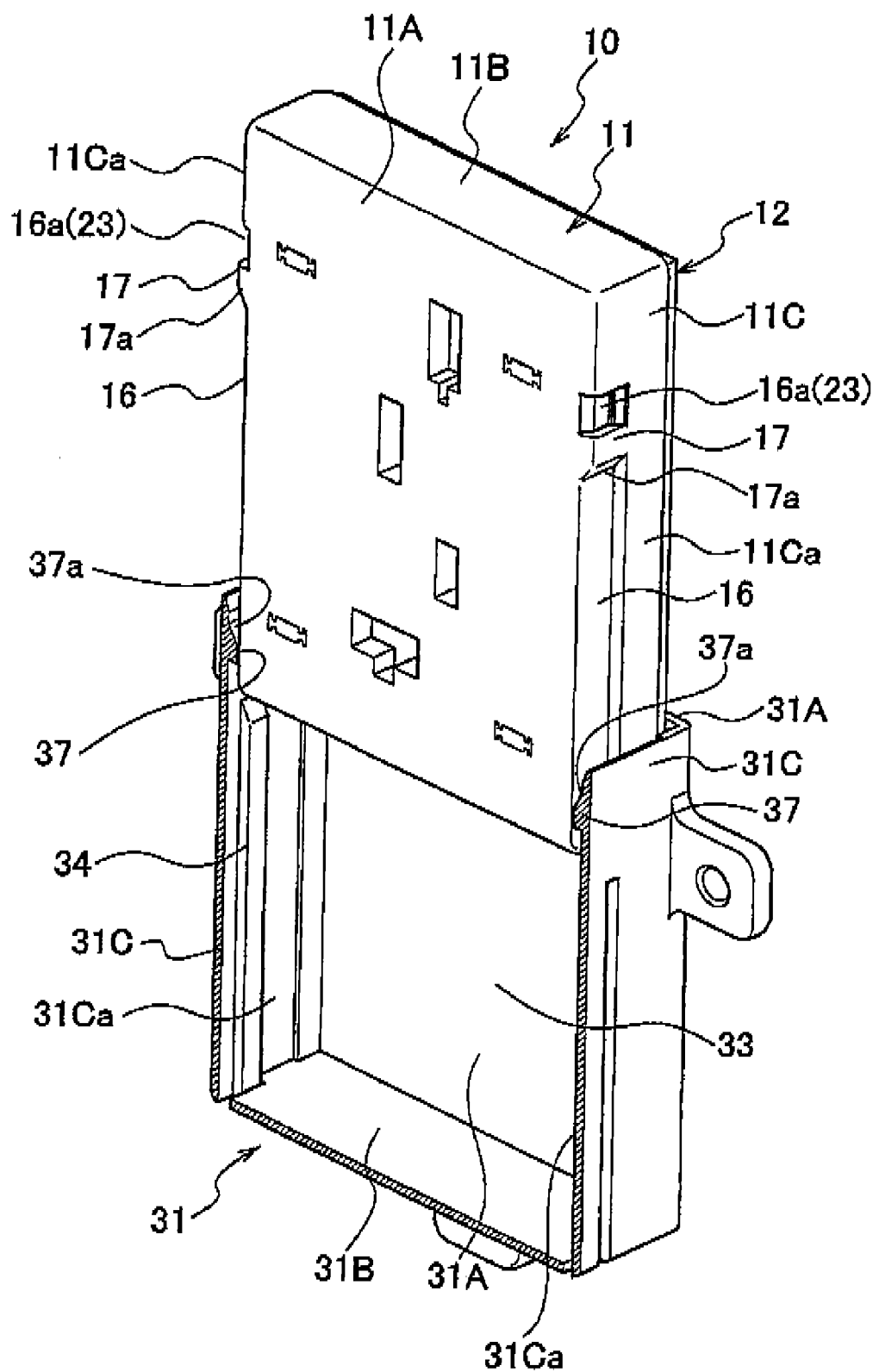
FIG. 3 is a perspective view showing a cross-section of a part in the state of FIG. 2.
Figure 4:
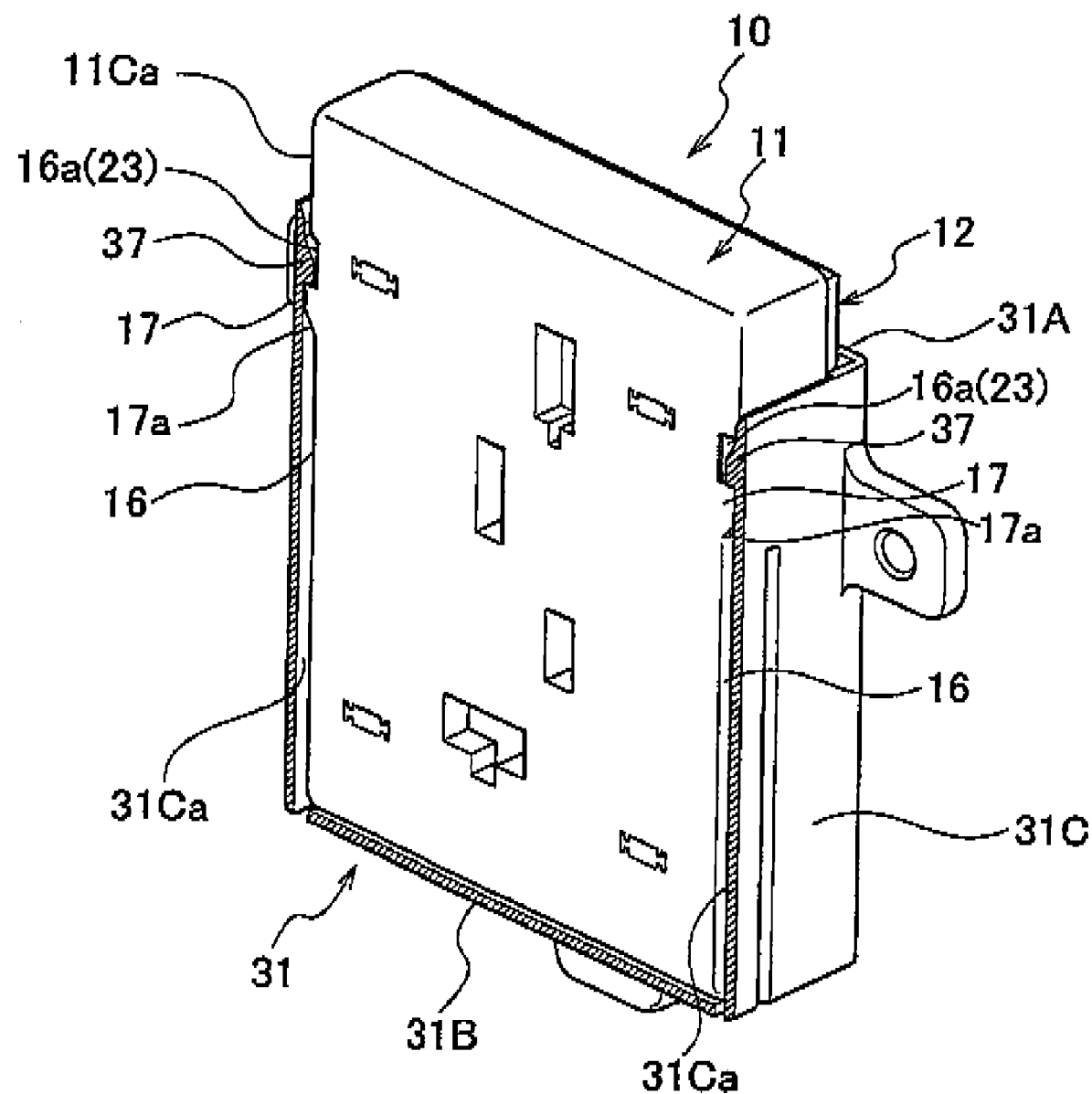
FIG. 4 is a perspective view showing a cross-section of a part in the state where the electric connection box is accommodated in the lower cover of the accommodation box.
Figure 5:
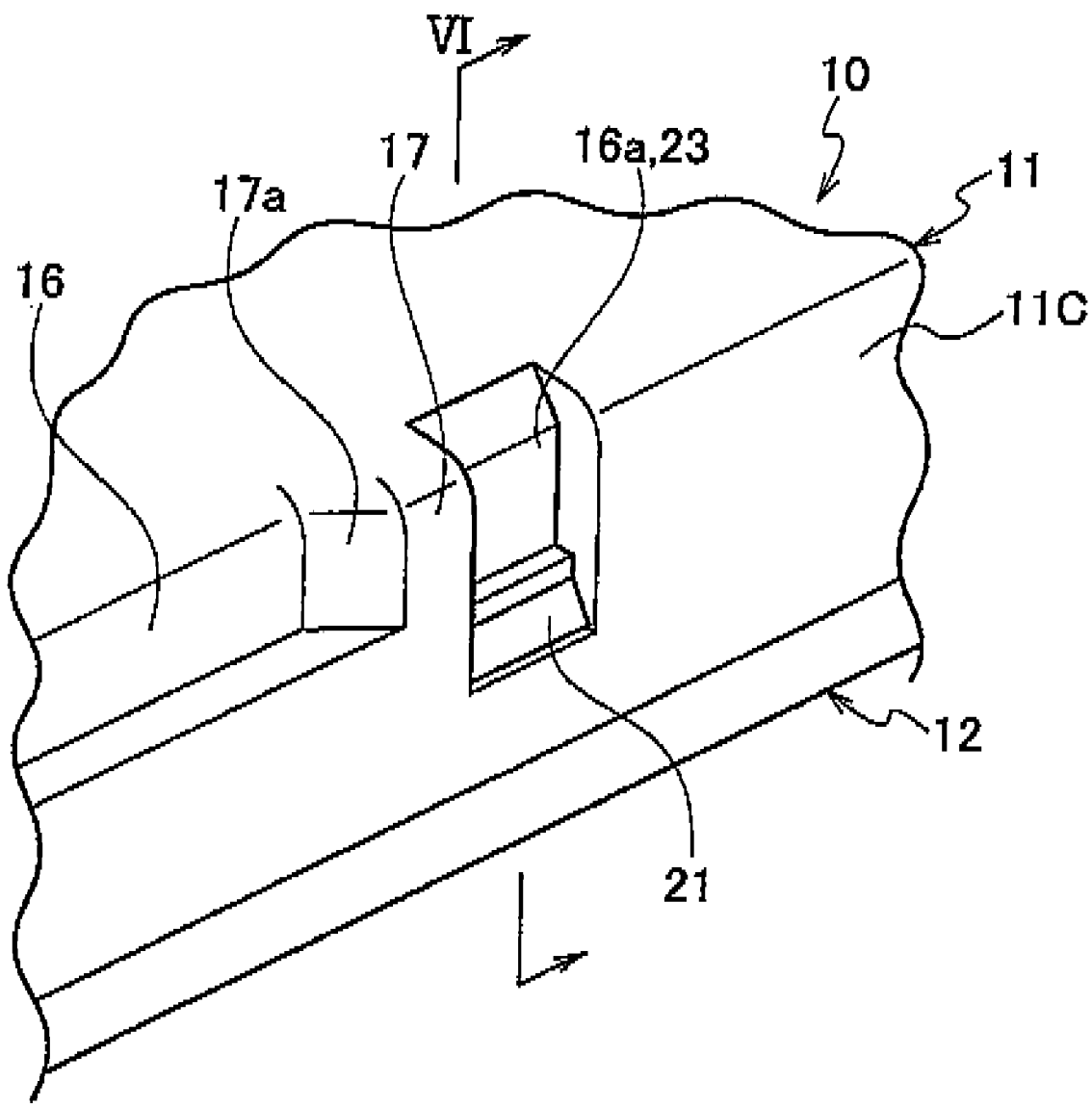
FIG. 5 is an external perspective view showing a structure of a lock portion of a lower case and an upper case of the electric connection box.
Figure 6:
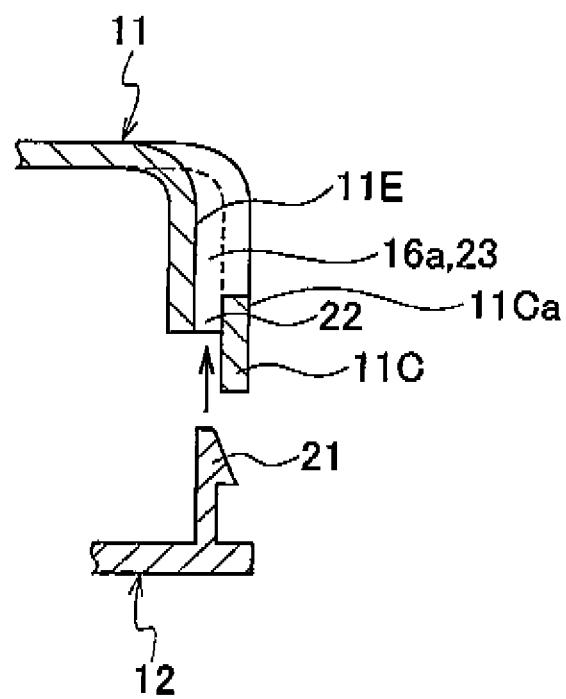
FIG. 6 shows a cross-section taken along the line VI-VI of FIG. 5 before the locking operation.
Figure 7:
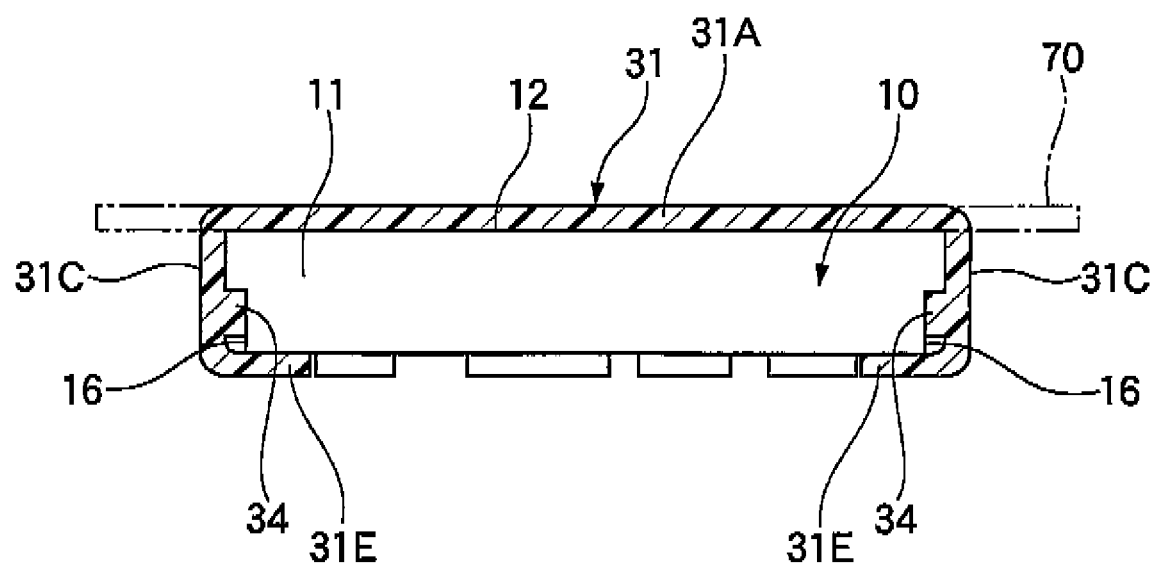
FIG. 7 is a sectional view showing a perpendicular surface to an insertion direction in a state where the electric connection box is accommodated in the lower cover of the accommodation box of FIG. 4.

FIG. 1 is a perspective view showing a relationship between an electric connection box and an accommodation box according to a first embodiment of the invention. FIG. 2 is a perspective view showing the state where the electric connection box is being inserted into a lower cover of the accommodation box. FIG. 3 is a perspective view showing a cross-section of a part in the state of FIG. 2. FIG. 4 is a perspective view showing a cross-section of a part in the state where the electric connection box is accommodated in the lower cover of the accommodation box. FIG. 5 is an external perspective view showing a structure of a lock portion of a lower case and an upper case of the electric connection box. FIG. 6 shows a cross-section taken along the line VI-VI of FIG. 5 before the locking operation. FIG. 7 is a sectional view showing a perpendicular surface to an insertion direction in a state where the electric connection box is accommodated in the lower cover of the accommodation box of FIG. 4.

In FIG. 1, an electric connection box 10 and an accommodation box 30 used to accommodate the electric connection box are shown. Outside of the accommodation box 30 is attached with a fixed bracket 70 so as to be fixed to a vehicle body by means of a bolt.

The electric connection box 10 has a configuration in which an electric component (not shown) is accommodated in a space formed by the combination of an upper case 11 and a lower case 12 formed of a resin. In addition, the accommodation box 30 includes a lower cover (in some cases, referred to as "accommodation box" in a single body) 31 and an upper cover 32 which engages with the lower cover so as to cover the front side of the lower cover.

The upper case 11 of the electric connection box 10 is formed in a square box shape which has a square front wall 11A, upper and lower walls 11B, and right and left walls 11C, where the upper and lower walls and the right and left walls are continuously formed in four sides of the square shape. Each of the outer surfaces (outer surfaces 11Ca) of the right and left walls 11C is provided with a groove-shaped concave portion 16 and an engagement convex portion 17.

The groove-shaped concave portion 16 extends in a direction in which the electric connection box 10 is inserted into the lower cover 31 (in a direction from the upside to the downside of FIG. 1). The engagement convex portion 17 is formed in the course of the extension direction of the concave portion 16, and a concave portion 16a is formed on the rear side (upside) in the insertion direction. The engagement convex portion 17 protrudes from the bottom surface of the concave portion 16, and has a height not more than a height of the concave portion 16. In this example, the engagement convex portion 17 has the height equal to the height of the concave portion 16, and a top surface thereof and the outer surface 11Ca are formed on the same surface.

In addition, as shown in FIG. 3, the front end surface of the engagement convex portion 17 in the insertion direction is provided with an inclined surface 17a which is used to carry out an easy passing-over operation to an engagement portion 37 of the lower cover 31 of the accommodation box 30.

In this case, the electric connection box 10 is formed in a rectangular box shape, and the concave portion 16 and the engagement convex portion 17 are formed in two outer surfaces 11Ca of the electric connection box 10 which are parallel to each other.

In addition, as shown in FIGS. 5 and 6, in the upper case 11 and the lower case 12 which constitute the electric connection box 10, a locking operation is carried out in such a manner that a lock protrusion 21 of the lower case 12 is inserted into a lock hole 22 of the upper case 11. Each outer surface 11Ca of the upper case 11 is provided with an injection-mold frame extraction hole 23 which is used to form the lock hole 22. That is, a part of the side surface 11C is provided with a concave wall 11E which is recessed inward by one stage, and a part provided with the concave wall 11E is used as the frame extraction hole 23 upon forming the lock hole 22. Here, in this embodiment, the frame extraction hole 23 is used as the concave portion 16a on the rear side of the insertion direction of the engagement convex portion 17.

In addition, as shown in FIG. 1, the lower cover 31 of the accommodation box 30 includes a rear wall 31A (i.e., first wall), a lower wall 31B (i.e., fourth wall), right and left walls 31C (i.e., second and third walls), a lower front wall 31D (i.e., part of fifth wall), and right and left front walls 31E (i.e., part of fifth wall) which surround a space 33 used to accommodate the electric connection box 10. The rear wall 31A extends in the insertion direction of the electric connection box 10, and faces the bottom surface of the electric connection box 10 in the state where the electric connection box 10 is accommodated in the lower cover 31. The lower wall 31B faces the side surfaces of the electric connection box 10 at a deep side in the insertion direction in the state where the electric connection box 10 is accommodated in the lower cover 31. The right and left walls 31C extend from the rear wall 31A in a direction intersecting the insertion direction of the electric connection box 10, and face the right and left walls 11C of the electric connection box 10, respectively, in the state where the electric connection box 10 is accommodated in the lower cover 31. The lower front wall 31D and the right and left front walls 31E extend in the insertion direction, and extend from the right and left walls 31C so as to face the front wall 11A of the electric connection box 10 in the state where the electric connection box 10 is accommodated in the lower cover 31. In addition, the lower cover 31 is provided with an opening where the component provided on the front wall 11A of the electric connection box 10 is exposed by the lower front wall 31D and the right and left front walls 31E, Specifically, the lower front wall 31D and the right and left front walls 31E form at least a part of the outline of the opening, and extend from the right and left walls 31C so as to be close to each other. In FIG. 1, the area from the center portion of the front surface of the electric connection box 10 to the upper surface thereof is exposed in the state where the electric connection box 10 is accommodated in the lower cover 31. Since the component provided on the front wall 11A of the electric connection box 10 is exposed, it is possible to separate the component exposed from the lower cover 31 just by separating the upper cover 32 from the lower cover 31.

In this embodiment, the electric connection box 10 is accommodated in the lower cover 31 in such a manner that the electric connection box 10 is inserted into the lower cover 31 in a predetermined direction (in a downward direction of FIG. 1). In the lower cover 31 accommodating the electric connection box 10, the lower cover 31 surrounds the electric connection box 10 by means of the rear wall 31A, the lower wall 31B, the right and left walls 31C, the lower front wall 31D, and the right and left front walls 31E. At this time, as shown in FIG. 7, the electric connection box 10 is sandwiched by the rear wall 31A and the right and left front walls 31E in a thickness direction of the electric connection box 10.

Accordingly, the electric connection box 10 is applied with a sandwiching-pressing force from the rear wall 31A and the right and left front walls 31E, thereby suppressing a rattling movement of the electric connection box in a thickness direction in the state where the electric connection box is accommodated in the lower cover 31.

In addition, in the case where the electric connection box 10 is accommodated in the space 33 of the lower cover 31, even when the upper cover 32 is separated from the lower cover 31, the electric connection box 10 cannot freely fall from the lower cover 31 by means of the sandwiching-pressing support using the rear wall 31A and the right and left front walls 31E. Accordingly, it is possible to simply and promptly carry out the maintenance of the electric component and the like provided in the electric connection box 10.

As shown in FIG. 3, each of the inner surfaces (inner surfaces 31Ca) of the right and left walls 31C is provided with the engagement protrusion 37 which is pressed and displaced by the engagement convex portion 17 so as to allow the engagement convex portion 17 to pass over the engagement protrusion and so as to engage with the rear surface of the engagement convex portion 17 upon carrying out the insertion operation of the electric connection box 10. The engagement protrusion 37 of the lower cover 31 is provided in the right and left walls 31C of the inner surfaces 31Ca which are parallel to each other. In addition each of the inner surfaces 31Ca is provided with a guide rib 34 which is disposed so as to correspond to the concave portion 16 and guides the insertion operation of the electric connection box 10.

In addition, in the same manner as the relationship between the outer surfaces 11Ca of the electric connection box 10 and the inner surface 31Ca of the lower cover 31, the rear surface of the lower case 12 perpendicular to each outer surface 11Ca of the upper case 11 provided with the concave portion 16 is configured to serve as a guide surface together with an inner surface 31Aa of the rear wall 31A of the lower cover 31 of the accommodation box 30 facing the rear surface of the lower case 12, the guide surface being used to guide the insertion operation in which the electric connection box 10 is inserted into the lower cover 31.

In the case where the electric connection box 10 is accommodated in the accommodation box 30 having the above-described configuration, the electric connection box 10 is inserted into the lower cover 31 from the upside thereof. Accordingly, it is possible to smoothly insert the electric connection box 10 into the space 33 of the lower cover 31 by means of the guiding operation using the rib 34 and the inner surfaces 31Aa and 31Ca of the lower cover 31.

In addition, since the engagement convex portion 17 and the engagement protrusion 37 respectively provided in each outer surface 11Ca of the electric connection box 10 and each inner surface 31Ca of the lower cover 31 engage with each other during the insertion operation, the outer surface 11Ca and the inner surface 31Ca facing each other in parallel in the insertion direction, the electric connection box 10 is fixed to the lower cover 31 so as not to come off therefrom.

In this state, since the upper cover 32 covers the lower cover 31 so as to be locked thereto, it is possible to protect the electric connection box 10 in the state where the electric connection box 10 is accommodated in the accommodation box 30 so as to be fixed thereto.

The protrusion is not merely provided in each outer surface 11Ca of the electric connection box 10. That is, that the concave portion 16 is provided in each outer surface 11Ca of the eclectic connection box 10 so as to extend in the insertion direction of the electric connection box 10, and the engagement convex portion 17 is provided in the concave portion 16 so as to have a height not more than a height of the concave portion 16. Accordingly, it is possible to remove a portion protruding from the outer surface 11Ca. As a result, since the dimension can decrease as much as the area without the protruding portion, it is helpful for saving a space.

In addition, the engagement convex portion 17 is formed inside the concave portion 16. Accordingly, even in the case where the electric connection box 10 is dropped or collides with something, the deformation or damage of the engagement convex portion 17 hardly occurs, and the electric connection box 10 can be correctly inserted into the lower cover 31 of the accommodation box 30 without a rattling movement. In addition, since it is not necessary to provide a guide rail so as to protect the engagement convex portion 17, it is possible to insert the electric connection box 10 into the lower cover 31 of the accommodation box 30 by using the outer surface 11Ca provided with the concave portion 16 as a guide surface instead of a protruding portion such as a guide rail. Accordingly, since it is possible to prevent a problem that the guide rail is separated due to the limitation of the injection molding process and the guide performance is influenced by the separated guide rail, it is possible to improve the assembling operation.

The front surface of the engagement convex portion 17 in the insertion direction is provided with the inclined surface 17a. Accordingly, since it is possible to smoothly engage the engagement convex portion 17 with the engagement protrusion (engagement portion) 37 of the lower cover 31 it is possible to improve the assembling operation.

In addition, the concave portion 16 and the engagement convex portion 17 are provided in two outer surfaces 11Ca of the electric connection box 10 which are parallel to each other. In the lower cover 31 of the accommodation box 30, the engagement protrusion 37 is provided in two inner surfaces 31Ca which are parallel to each other. Accordingly, it is possible to stably fix both right and left sides of the electric connection box 10 in a balanced manner.

Further, the electric connection box 10 is inserted by using the concave portion 16 and the rib 34 as a guide, and the electric connection box 10 is inserted into the lower cover 31 by using two perpendicular surfaces as a guide. Accordingly, since it is possible to smoothly carry out the assembling operation, it is possible to improve the assembling operation.

Likewise, in this embodiment, the electric connection box 10 is accommodated in the lower cover 31 by inserting the electric connection box 10 into the lower cover 31. Also, in the accommodation box 30 accommodating the electric connection box 10, the upper cover 32 is mounted to the lower cover 31, and the lower cover 31 includes the rear wall 31A, the lower wall 31B, the right and left walls 31C, the lower front wall 31D, and the right and left front walls 31E which surround the space used to accommodated the electric connection box 10. The electric connection box 10 is configured to be supported in a sandwiched and pressed state by the rear wall 31A and the right and left front walls 31E of the electric connection box 10 in a thickness direction of the electric connection box 10. Accordingly, it is possible to prevent the electric connection box 10 from rattling in a thickness direction of the electric connection box 10 in the state where the electric connection box 10 is accommodated in the lower cover 31.

In addition, although the configuration is described in which the electric connection box 10 is supported in a sandwiched and pressed state by the rear wall 31A and the right and left front walls 31E, it is possible to obtain the same advantage even in the configuration in which the electric connection box 10 is supported in a sandwiched and pressed state by the rear wall 31A and the lower front wall 31D in a thickness direction of the electric connection box 10. In addition, although the configuration is described in which the lower cover 31 has an opening used to expose the component provided on the front wall 11A of the electric connection box 10, in the case where a wall portion is provided instead of the opening, the electric connection box 10 is supported in a sandwiched and pressed state in a thickness direction by the rear wall 31A and the wall portion.

Second Embodiment

Figure 8:
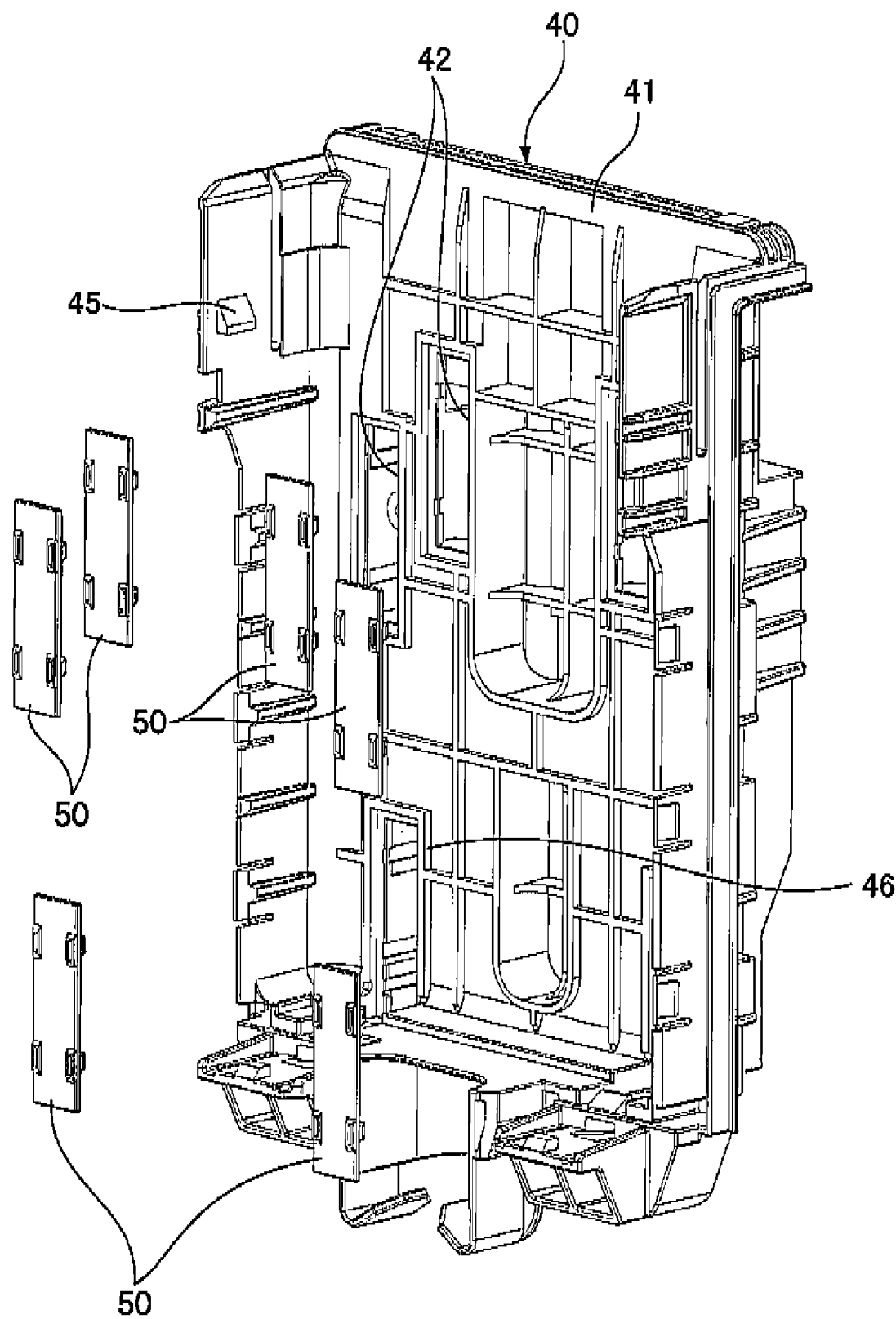
FIG. 8 is an exploded perspective view showing an external cover and a cap of the electric connection box according to a second embodiment of the invention.
Figure 9:
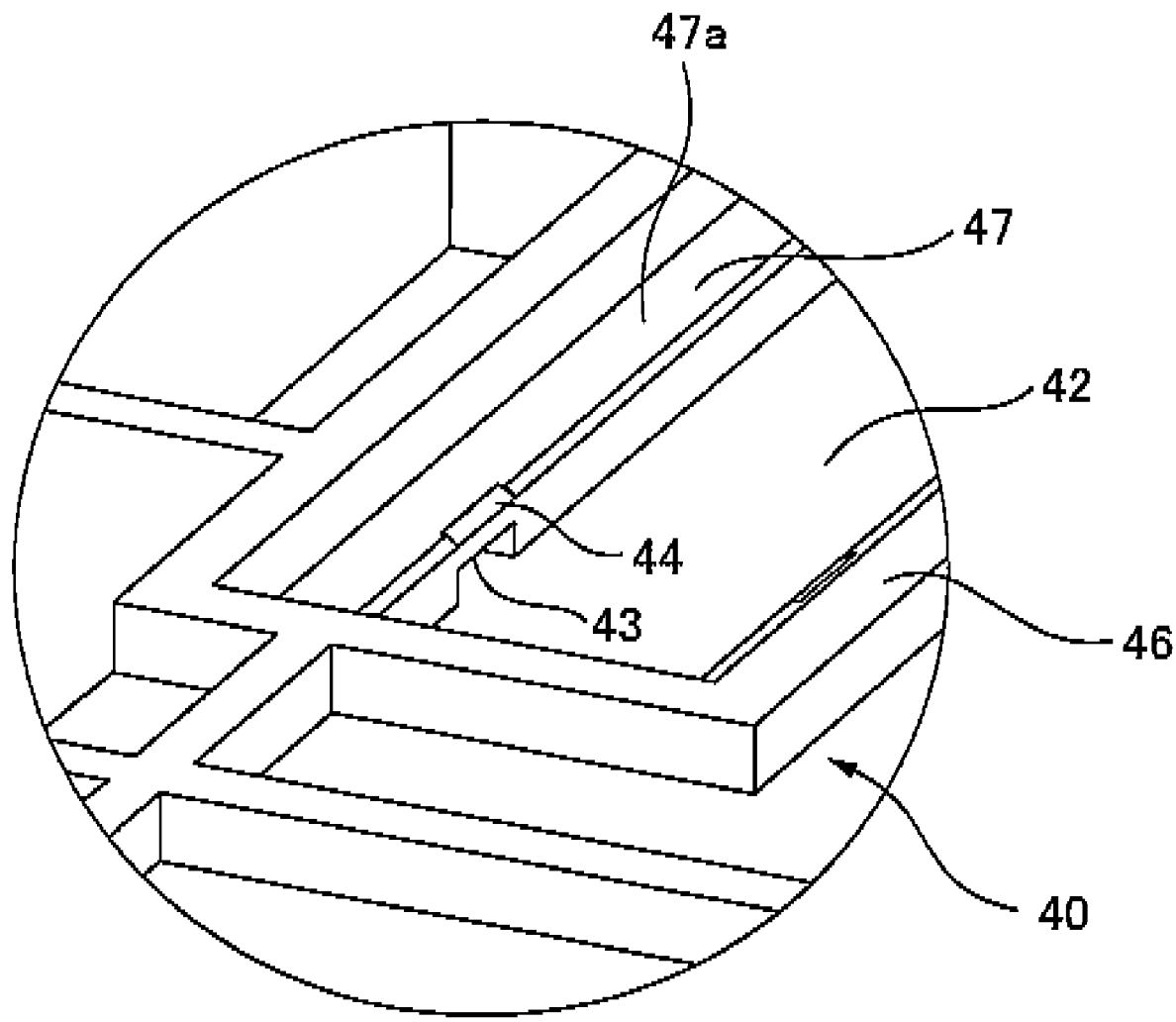
FIG. 9 is a perspective view showing a partial configuration of a frame-extraction opening of the lower cover mounted with the cap.
Figure 10A:
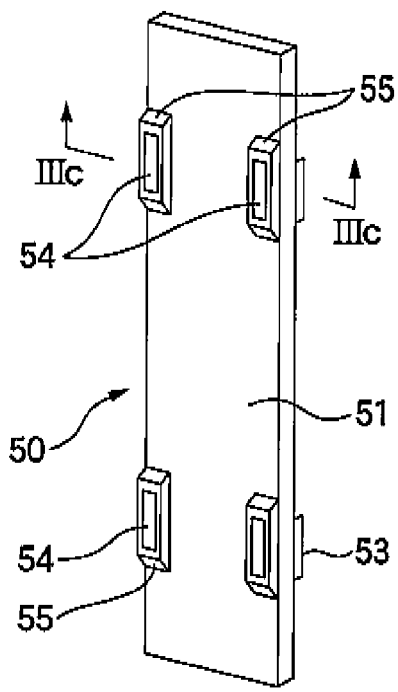
FIGS. 10A to 10C show a configuration of the cap: where
Figure 10C:
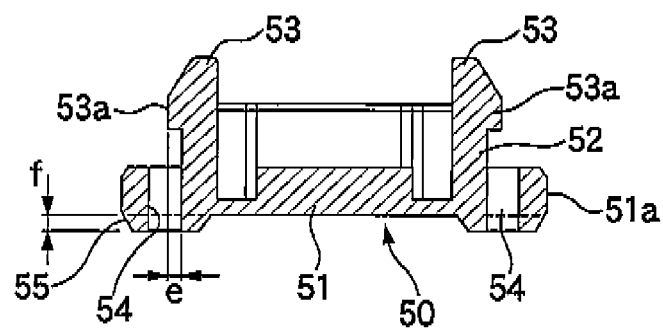
Figure 10B:
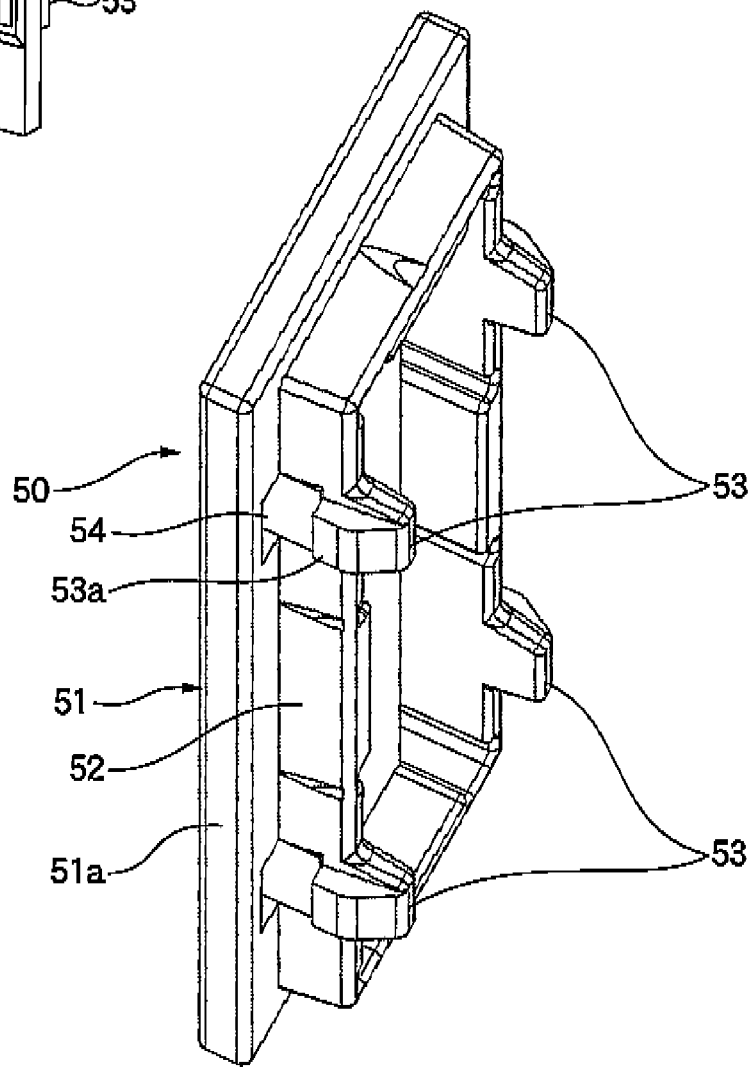
Figure 11:
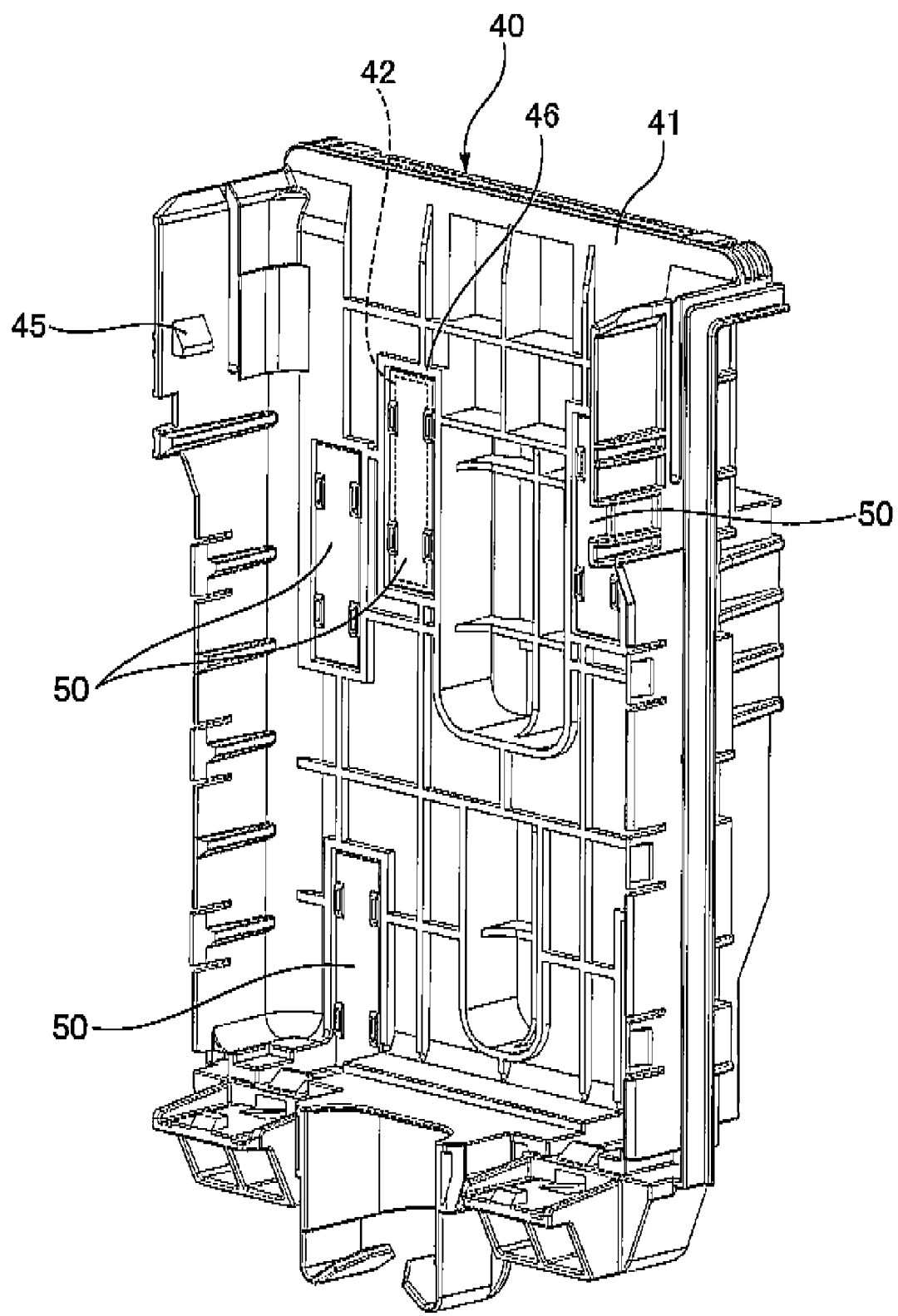
FIG. 11 is a perspective view showing the state where the frame-extraction opening of the lower cover is closed by the cap.
Figure 12:
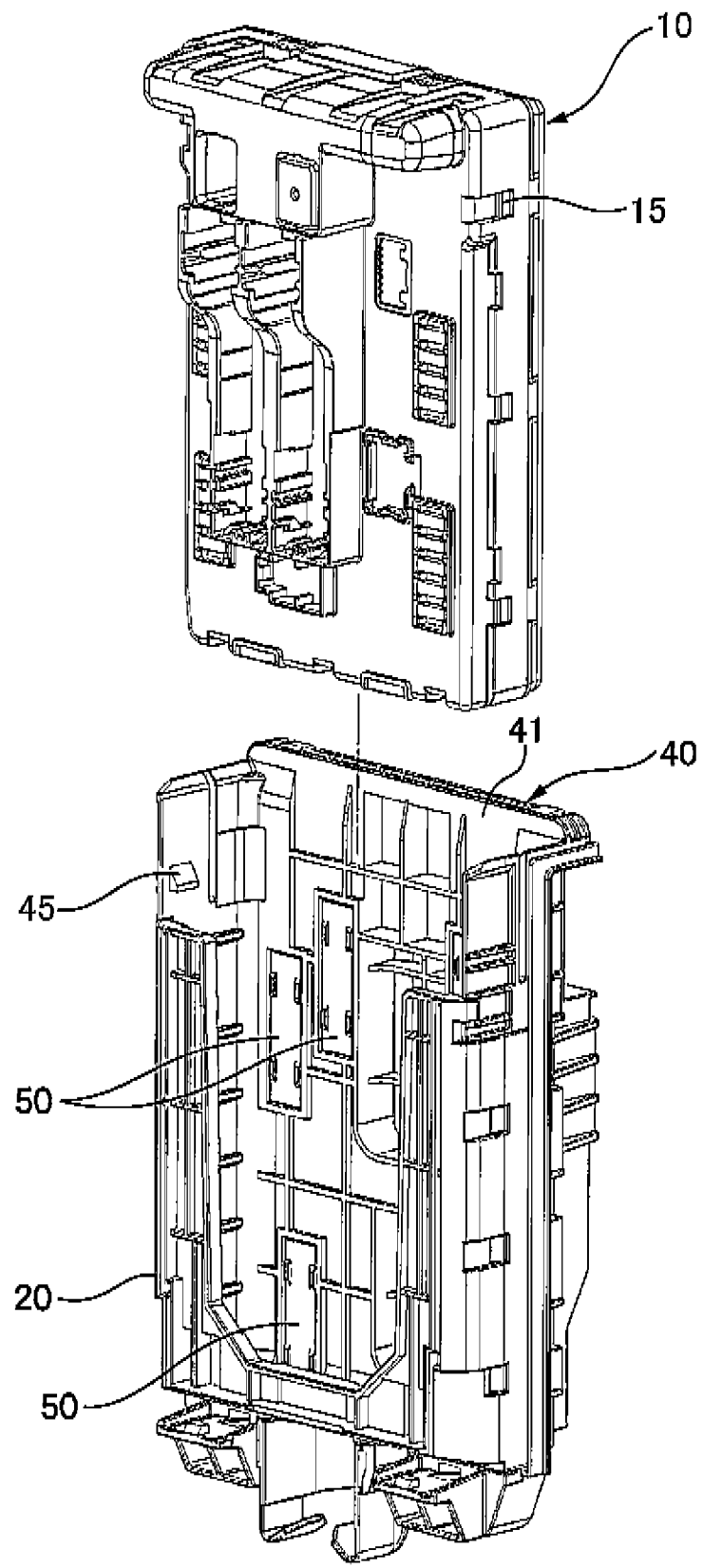
FIG. 12 is a perspective view showing the state where the electric connection box is about to be mounted to the lower cover in the state of FIG. 11.
Figure 13:
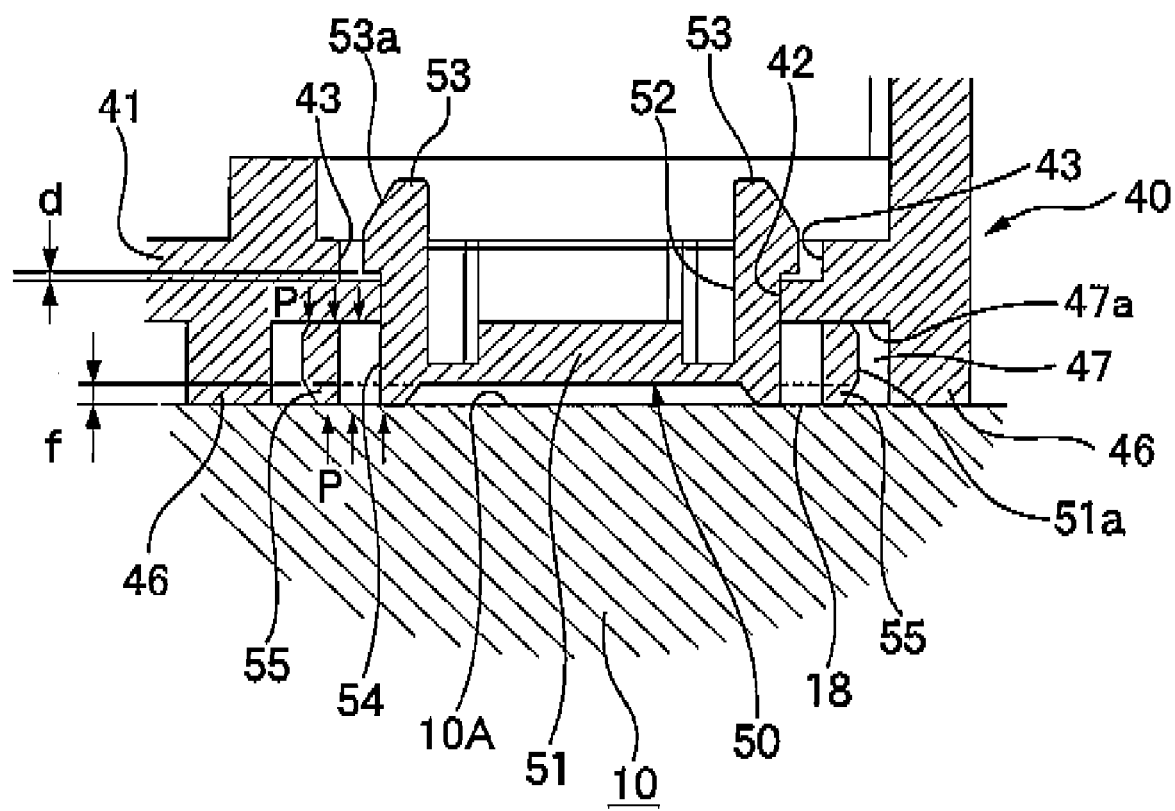
FIG. 13 is a sectional view showing a cap mounting portion in the state where the electric connection box is mounted.

A second embodiment, in which the rattling movement of the electric connection box is prevented, will be described with reference to FIGS. 8 to 13. FIG. 8 is an exploded perspective view showing an external cover and a cap of the electric connection box according to a second embodiment of the invention. FIG. 9 is a perspective view showing a partial configuration of a frame-extraction opening of the lower cover mounted with the cap. FIGS. 10A to 10C show a configuration of the cap: where FIG. 10A is a perspective view when viewed from the front side thereof, FIG. 10B is a perspective view when viewed from the rear side thereof and FIG. 10C is a sectional view taken along the arrow IIIc-IIIc of FIG. 10A. FIG. 11 is a perspective view showing the state where the frame-extraction opening of the lower cover is closed by the cap. FIG. 12 is a perspective view showing the state where the electric connection box is about to be mounted to the lower cover in the state of FIG. 11. FIG. 13 is a sectional view showing a cap mounting portion in the state where the electric connection box is mounted.

In this embodiment, plural caps 50 are respectively fitted to frame-extraction rectangular openings 42 provided in the inner surface of a rear wall 41 which guides an operation in which the electric connection box 10 is inserted into a lower cover 40. Hereinafter, a structure of each cap 50 and a structure in the vicinity of each frame-extraction opening 42, to which the cap 50 is fitted, will be described.

In some cases, a frame-extraction hole used to extract a mold is provided in a resin molded product due to a condition of a molding process. If this kind of frame-extraction hole exists in the lower cover 40 of the electric connection box required to have a water-resistant property, rainwater or the like may enter the frame-extraction hole. For this reason, the frame-extraction hole is closed by the cap 50.

In the electric connection box accommodating box according to this embodiment, the electric connection box 10 is accommodated in the lower cover 40 which is formed of a synthetic resin (for example, PPE) and is shown in FIGS. 8 and 12. As the wall surfaces surrounding the space used to accommodate the electric connection box 10, at least the rear wall 41 and right and left front walls 20 are provided. As shown in FIG. 8, the rear wall 41 is provided with plural frame-extraction rectangular openings 42 (in the example shown in the drawing, the number is six) used upon molding the lower cover 40 by means of a resin, the plural openings being arranged in a distributed manner.

In this case, as shown in FIG. 13, a rib 46 (i.e., a protrusion) protrudes from the inner surface of the rear wall 41 of the lower cover 40 so as to come into contact with a bottom surface 10A of the electric connection box 10. As shown in FIG. 9, the frame-extraction opening 42 is formed in a bottom surface 47a of an inner concave portion 47 surrounded by the rib 46. In addition, as shown in FIG. 12, in order to lock the accommodated electric connection box 10, the lower cover 40 is provided with a lock portion 45 which engages with a lock portion 15 of the electric connection box 10.

In addition, as shown in FIG. 11, in order to close each frame-extraction opening 42, the cap 50 which is formed of a synthetic resin (for example, PP) is fitted to each frame-extraction opening 42 of the lower cover 40 so as to be locked thereto.

As shown in FIGS. 10A to 10C, the cap 50 includes a surface plate 51 which has a rectangular shape larger than that of the frame-extraction rectangular opening 42 of the lower cover 40; a rectangular-frame-shaped circumferential wall 52 which protrudes from the rear surface of the surface plate 51 so as to be fitted to the inner periphery of the frame-extraction opening 42; four lock portions 53 which protrude from the facing long sides of the circumferential wall 52.

The whole circumferential edge of the surface plate 51 is formed into a flange portion 51a which closely contacts with the bottom surface 47a of the concave portion 47 of the lower cover 40, and the circumferential wall 52 is provided in a protruding manner on the inside of the flange portion 51a. The outer surface of the front end of each lock portion 53 is provided with an engagement protrusion 53a, and the flange portion 51a is provided with a frame-extraction hole 54 in order to form each engagement protrusion 53a. That is, as shown in FIG. 10C, in order to ensure an outside protrusion amount "e" of the engagement protrusion 53a, the flange portion 51a of the surface plate 51 is provided with the frame-extraction hole 54.

On the other hand, as shown in FIG. 9, the rear surface of the circumferential edge of the frame-extraction opening 42 of the lower cover 40 is provided with an engagement concave portion 43 which engages with the engagement protrusion 53a of each lock portion 53. In order to easily insert the engagement protrusion 53a into the engagement concave portion 43, the front surface of the circumferential edge of the frame-extraction opening 42 is provided with a surface cut portion 44.

In addition, the circumferential edge of the front surface of each frame-extraction hole 54 of the cap 50 is provided with a thick portion 55 (i.e., a protrusion) which is continuously formed in the whole circumference of the frame-extraction hole 54 (even in the cap 50 itself, a small frame-extraction hole exists in order to form the cap 50). The thick portion 55 is formed to have a height "f1 protruding from the concave portion 47 (i.e., the upper end of the rib 46) in the state where the cap 50 is fitted to the frame-extraction opening 42 formed in the bottom surface 47a of the concave portion 47.

Further, in the state where the cap 50 is fitted to each frame-extraction opening 42 so that the engagement protrusion 53a of the lock portion 53 engages with the engagement concave portion 43 of the lower cover 40 (see FIG. 11), as shown in FIG. 12, the electric connection box 10 is accommodated in the lower cover 40. Accordingly, as shown in FIG. 13, the bottom surface 10A of the electric connection box 10 comes into contact with the upper surface of the rib 46 of the lower cover 40. In this state, the bottom surface 10A of the electric connection box 10 closes contacts with the thick portion 55 of the cap 50 protruding from the concave portion 47, and the bottom surface 10A of the electric connection box 10 closes the frame-extraction hole 54 of the cap 50. In addition, the flange portion 51a of the cap 50 closely contacts with the bottom surface 47a of the concave portion 47. That is, a pressing force P is applied from the bottom surface 10A of the electric connection box 10 to the thick portion 55, and hence the pressing force P acts between the flange portion 51a and the bottom surface 47a of the concave portion 47.

With such a configuration, in the state where the electric connection box 10 is accommodated in the lower cover 40, the pressing force P is applied from the thick portion 55 of the cap 50, fitted to the frame-extraction opening 42 of the lower cover 40, to the bottom surface of the electric connection box 10. As a result, since the electric connection box 10 is applied with a sandwiching-pressing force of the right and left front walls 20 and the thick portion 55 protruding from the rear wall 41, it is possible to more reliably suppress the rattling movement of the electric connection box 10 in a thickness direction in the state where the electric connection box 10 is accommodated in the lower cover 40.

With such a configuration, it is possible to select the cap 50 provided with the thick portion 55 having the optimal protruding shape for suppressing the rattling movement. That is, the cap 50 is selected which is provided with the thick portion 55 having a protruding height F substantially equal to a gap between the inner surface of the rear wall 41 of the lower cover 40 and the bottom surface 10A of the electric connection box 10 in the state where the electric connection box 10 is accommodated in the lower cover 40. Subsequently, the cap 50 is fitted to the frame-extraction opening 42 of the lower cover 40. Accordingly, in the state where the electric connection box 10 is accommodated in the lower cover 40 while being applied with the sandwiching-pressing force of the right and left front walls 20 and the thick portion 55 protruding from the rear wall 41, it is possible to more reliably suppress the rattling movement of the electric connection box 10 in a thickness direction.

The cap 50 is mounted to, for example, six positions of the inner surface of the rear wall 41. The number of installed caps 50 and the arrangement thereof are determined in consideration of whether the electric connection box 10 can be smoothly inserted between the right and left front walls 20 and the inner surface of the rear wall 41 and the balanced support can be carried out in a sandwiched and pressed state.

Accordingly, even when a part of the sandwiching-pressing force applied to the electric connection box 10 is reduced due to the deformation of the rear wall 41 or the right and left front walls 20 after the electric connection box 10 is accommodated in the lower cover 40, since the sandwiching-pressing force is maintained by the thick portion 55 of the cap 50, it is possible to reliably suppress the rattling movement of the electric connection box 10.

Further, in the case where the cap 50 is detachably attached to the rear wall 41 of the lower cover 40, the cap 50 may be selected which is provided with the thick portion 55 having the appropriate shape and size for the thickness of the electric connection box 10. Accordingly, it is possible to reliably carry out the insertion operation in which the electric connection box 10 is inserted into the lower cover 40 and the sandwiching-pressing support of the electric connection box 10.

Furthermore, in this embodiment, the configuration is described in which the cap 50 is fitted to the frame-extraction opening 42 of the lower cover 40 so that the electric connection box 10 is sandwiched by the right and left front walls 20 and the thick portion 55 of the cap 50. Alternatively, even in the configuration in which a protrusion portion may be formed in a protruding manner in the inner side portion of the rear wall 41 of the lower cover 40 so that the electric connection box 10 is sandwiched by the right and left front walls 20 and the protrusion portion, it is possible to reliably suppress the rattling movement of the electric connection box 10. The protrusion portion corresponds to, for example, the rib 46 according to this embodiment. In the state where the electric connection box 10 is accommodated in the lower cover 40, the bottom surface of the electric connection box 10 is applied with a pressing force from the rib 46 provided in the inner side portion of the rear wall 41 of the lower cover 40. As a result, since the electric connection box 10 is applied with the sandwiching-pressing force of the right and left front walls 20 and the rib 46 protruding from the rear wall 41, it is possible to more reliably suppress the rattling movement of the electric connection box 10 in a thickens direction in the state where the electric connection box 10 is accommodated in the lower cover 40.

Figure 14:
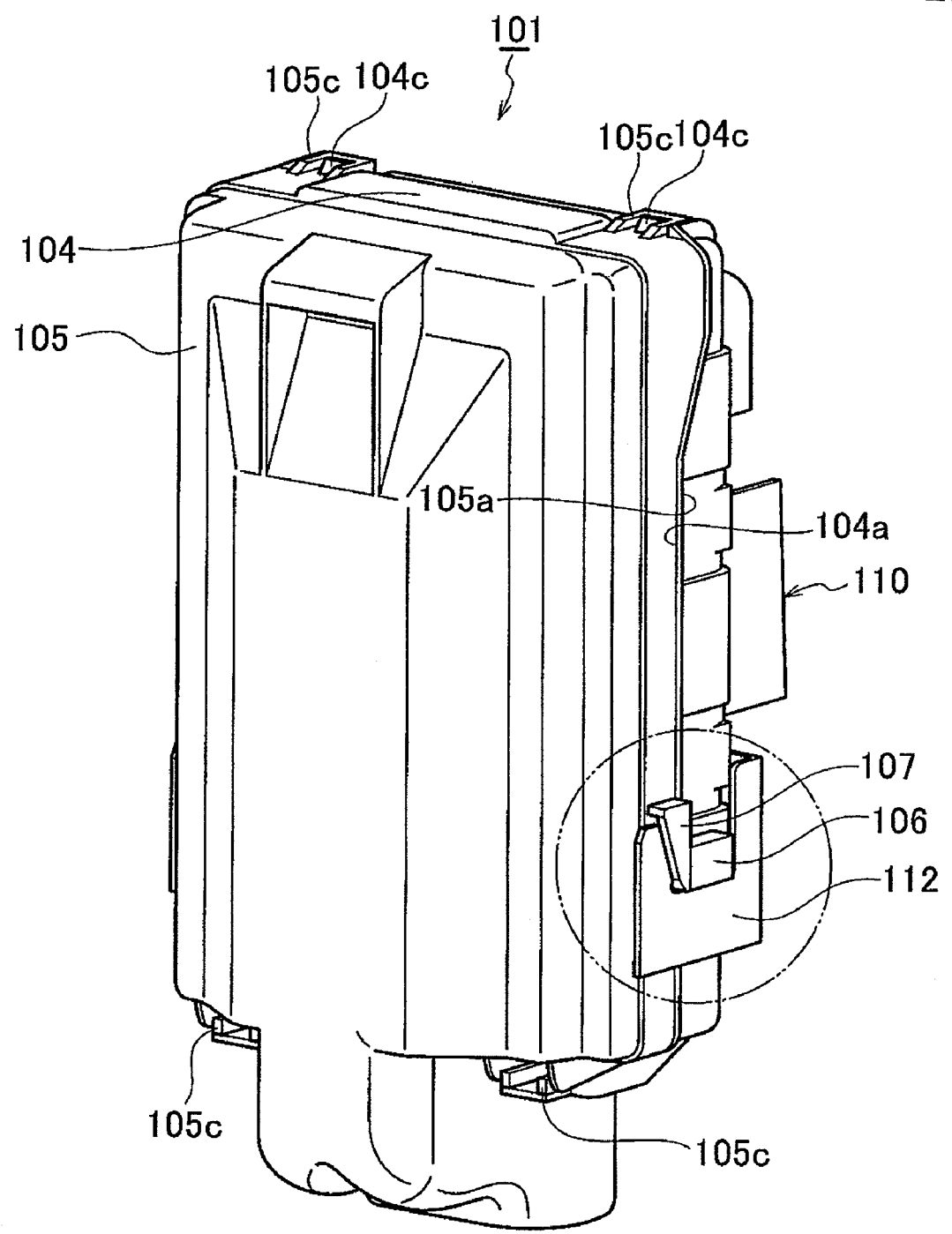
FIG. 14 is a perspective view showing an electric connection box accommodating box according to the related art.
Figure 15:
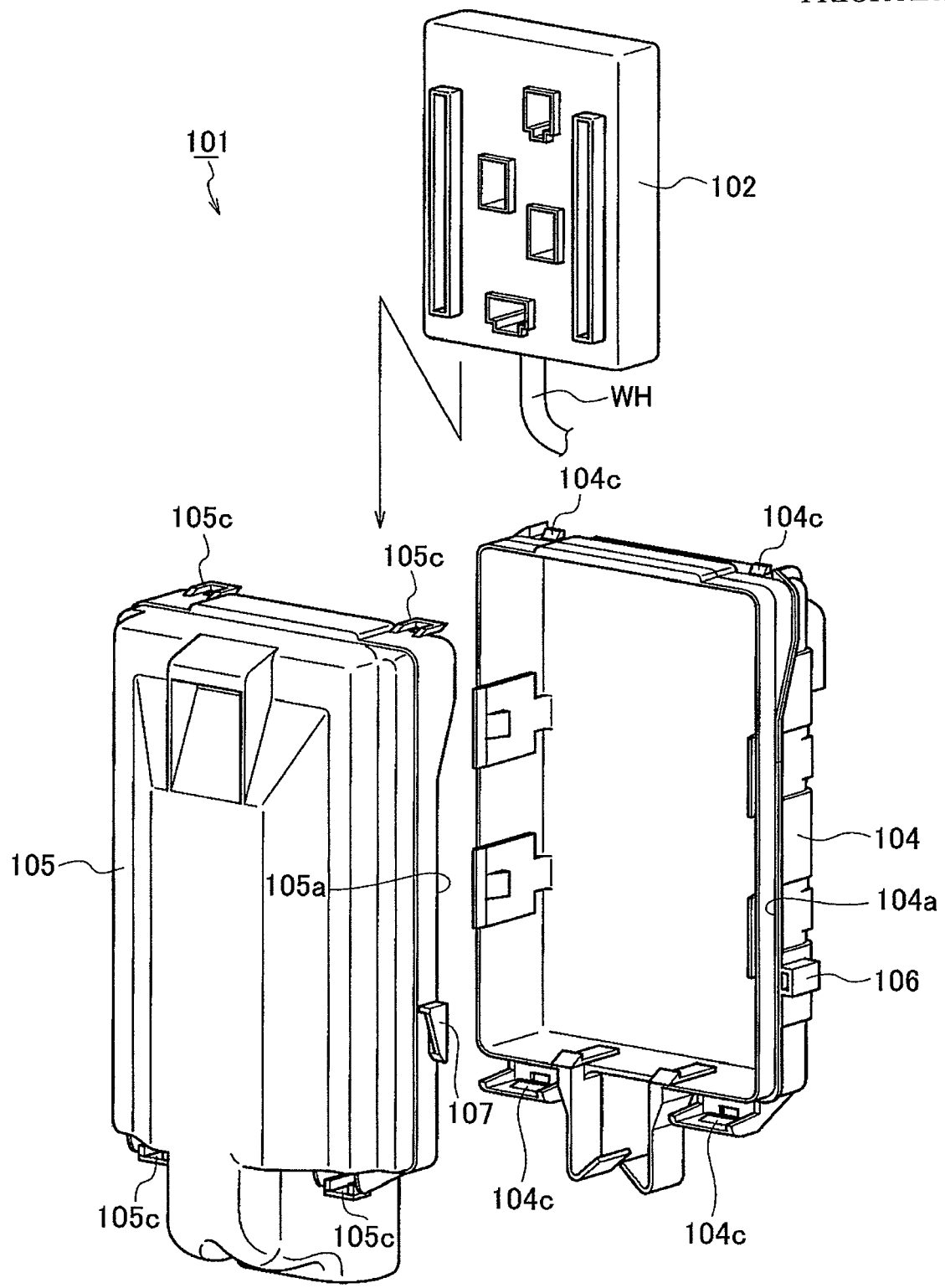
FIG. 15 is an exploded perspective view showing the electric connection box accommodating box according to the related art.
Figure 16:
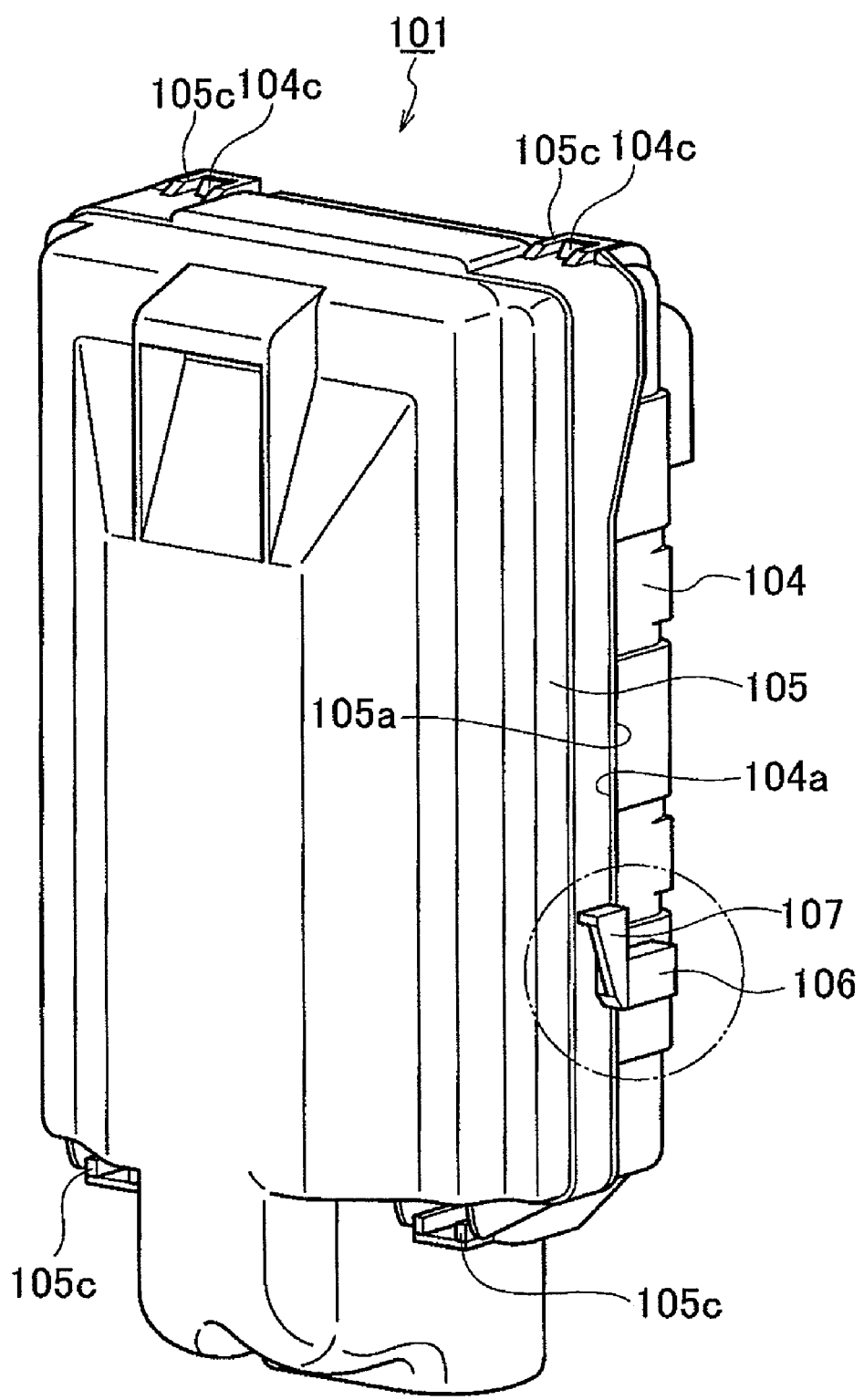
FIG. 16 is a perspective view showing the state where the electric connection box accommodating box according to the related art is assembled.

Incidentally, the electric connection box accommodating box according to the related art is shown in FIGS. 14, 15, and 16. FIG. 14 is a perspective view showing an electric connection box accommodating box according to the related art. FIG. 15 is an exploded perspective view showing the electric connection box accommodating box according to the related art. FIG. 16 is a perspective view showing the state where the electric connection box accommodating box according to the related art is assembled.

In the accommodation box for accommodating an electric connection box according to the related art, a bracket 110 is fixed in advance to a vehicle-body panel or the like having a predetermined mounting space of an electric connection box 101 by means of a welding operation, a bolt fastening operation, or the like. First, an electric connection box body 102 is accommodated in an under case member 104 and an upper case member 105. Subsequently, the under case member 104 and the upper case member 105 are attached to each other by means of combining surfaces 104a and 105a so as to be locked by lock portions 104c and 105c, thereby obtaining the assembled electric connection box 101. Subsequently, the assembled electric connection box 101 is inserted from the upside while sliding along a rear surface plate portion of the bracket 110 for an insertion operation, and a pair of right and left lock protrusion portions 106 and 107 respectively provided in the under case member 104 and the upper case member 105 is inserted until being locked to a pair of right and left case hook portions 112 of the bracket 110. Accordingly, the attachment of the electric connection box 101 ends. By adopting the configuration in which the lock protrusion portion 106 of the under case member 104 and the lock protrusion portion 107 of the upper case member 105 are fitted to the case hook portion 112, the rattling movement of the electric connection box 101 is prevented.

From the comparison between the accommodation box according to the related art and the accommodation box according to the invention, the following advantages are obtained from the accommodation box according to the invention. That is, since the rattling movement of the electric connection box accommodated in the space formed by the upper case 11 and the lower case 12 can be prevented without the case hook portion provided in the bracket, it is possible to obtain the bracket having the simpler and easier structure. In addition, since the area of the bracket in a plane development largely decreases due to the removed case hook portion, it is possible to improve the yield of the material used for forming the bracket and to reduce the material cost.

A box for accommodating an electric connection box according to the invention may be formed in the following configurations (1) to (6).

(1) A box for accommodating an electric connection box, including:
  a lower cover which comprises a plurality of walls for surrounding a space to accommodate the electric connection box toward a predetermined insertion direction, the plurality of walls including:
    a first wall which extends along the insertion direction;
    second and third walls which extend from the first wall in a direction intersecting the insertion direction and faces each other;
    a fourth wall which extends from the first, second and third walls at a deep side of the insertion direction so as to support the electric connection box; and
    a fifth wall which extends from the second and third walls along the insertion direction, and is substantially parallel to the first wall so as to press-sandwich the electric connection box by the first and fifth walls; and
  an upper cover which is mounted to the lower cover so as to cover an exposed part of the electric connection box to be accommodated in the lower cover.

(2) The box according to the configuration (1), wherein the fifth wall includes facing wall portions which extend from the second and third walls so as to be close to each other and an opening formed between the facing wall portions to expose a surface of the electric connection box to be accommodated in the lower cover, and wherein the first wall and the facing wall portions press-sandwich the electric connection box to be accommodated in the lower cover.

(3) The box according to the configuration (2), wherein the first wall includes a protrusion which protrudes toward the facing wall portions, and wherein the protrusion and the facing wall portions press-sandwich the electric connection box to be accommodated in the lower cover.

(4) The box according to the configuration (2), further including: a hole disposed on the first wall; a cap which is to be fined to the hole; a protrusion which protrudes from the cap toward the facing wall portions, wherein the protrusion and the facing wall portions press-sandwich the electric connection box to be accommodated in the lower cover.

(5) The box according to the configuration (2), wherein the fifth wall includes a bridge wall which connects the facing wall portions at the deep side of the insertion direction.

(6) The box according to the configuration (4), wherein the hole includes a first engagement portion, wherein the cap includes a flat plate and a second engagement portion to be engaged with the first engagement portion, wherein the first wall includes a rib which protrudes toward the facing wall portions, and wherein when the cap is fitted to the hole, the protrusion and the rib press-sandwich the electric connection box According to the box of the above configurations, since the electric connection box is supported in a sandwiched and pressed state by the first and fifth walls of the lower cover in the state where the electric connection box is accommodated in the lower cover, it is possible to prevent the electric connection box from rattling in a thickness direction. Accordingly, it is possible to prevent in advance occurrence of a short-circuit state or damage of an electronic component or the like provided in the electric connection box. In addition, in the case where the electric connection box is accommodated in the space provided inside the lower cover, even when the upper cover is separated from the lower cover, the electric connection box cannot freely fall from the lower cover by means of the support using the fourth wall. Accordingly, it is possible to simply and promptly carry out the maintenance of the electric component and the like provided in the electric connection box.

According to box of the above configurations, in the state where the electric connection box is accommodated in the lower cover, since the component provided in the fifth side surface of the electric connection box is exposed, it is possible to separate the component exposed from the lower cover just by separating the upper cover from the lower cover.

According to box of the above configurations, since the first wall is provided with the protrusion portion protruding by the length substantially equal to the gap between the first wall of the lower cover and the first side surface of the electric connection box in the state where the electric connection box is accommodated in the lower cover, the electric connection box is applied with the sandwiching-pressing force of the protrusion portion and the fifth wall, thereby suppressing the rattling movement of the electric connection box in a thickness direction in the state where the electric connection box is accommodated in the lower cover. Also, even when a part of the sandwiching-pressing force applied to the electric connection box is reduced due to the deformation of the first and fifth walls after the electric connection box is accommodated in the lower cover, since the bottom surface of the electric connection box is supported by the protrusion portion, it is possible to reliably suppress the rattling movement of the electric connection box. In addition, when plural protrusion portions are provided in the rear wall of the lower cover, it is possible to further improve the above-described advantage.

According to the box of the above configurations, since the cap can be selected which has the protrusion portion having the appropriate shape and size for the gap between the first wall of the lower cover and the first side surface of the electric connection box in the state where the electric connection box is accommodated in the lower cover, it is possible to reliably carry out the insertion operation in which the electric connection box is inserted into the lower cover and the sandwiching-pressing support of the electric connection box.

What is claimed is:

1. A box for accommodating an electric connection box, comprising: a lower cover which comprises a plurality of walls for surrounding a space to accommodate the electric connection box toward a predetermined insertion direction, the plurality of walls including: a first wall which extends along the insertion direction; second and third walls which extend from the first wall in a direction intersecting the insertion direction and faces each other; a fourth wall which extends from the first, second and third walls at a deep side of the insertion direction so as to support the electric connection box; and a fifth wall which includes a right front wall and a left wall extended along the insertion direction, and is substantially parallel to the first wall so as to press-sandwich the electric connection box by the first and fifth walls; and an upper cover which is mounted to the lower cover so as to cover an exposed part of the electric connection box to be accommodated in the lower cover, wherein the right front wall and the left front wall extend, respectively, from the second and third walls so as to be close to each other and an opening formed between the right front wall and the left front wall exposes a surface of the electric connection box to be accommodated in the lower cover, wherein the first wall, the right front wall and the left front wall press-sandwich the electric connection box to be accommodated in the lower cover, wherein an inner surface of the first wall includes a protrusion which protrudes toward the right front wall and the left front wall, and wherein the protrusion, the right front wall and the left front wall press-sandwich the electric connection box to be accommodated in the lower cover.

2. The box according to claim 1, wherein the fifth wall includes a bridge wall which connects the right front wall and the left front wall at the deep side of the insertion direction.

3. A box for accommodating an electric connection box, comprising: a lower cover which comprises a plurality of walls for surrounding a space to accommodate the electric connection box toward a predetermined insertion direction, the plurality of walls including: a first wall which extends along the insertion direction; second and third walls which extend from the first wall in a direction intersecting the insertion direction and faces each other; a fourth wall which extends from the first, second and third walls at a deep side of the insertion direction so as to support the electric connection box; and a fifth wall which includes a right front wall and a left front wall extended along the insertion direction, and is substantially parallel to the first wall so as to press-sandwich the electric connection box by the first and fifth walls; and an upper cover which is mounted to the lower cover so as to cover an exposed part of the electric connection box to be accommodated in the lower cover; wherein the right front wall and the left front wall extend, respectively, from the second and third walls so as to be close to each other and an opening formed between the right front wall and the left front wall exposes a surface of the electric connection box to be accommodated in the lower cover, wherein the first wall, the right front wall and the left front wall press-sandwich the electric connection box to be accommodated in the lower cover, and wherein the box further comprises: a hole disposed on the first wall; a cap which is to be fitted to the hole; and a protrusion which protrudes from the cap toward the right front wall and the left front wall, wherein the protrusion, the right front wall and the left front wall press-sandwich the electric connection box to be accommodated in the lower cover.

4. The box according to claim 3, wherein the hole includes a first engagement portion, wherein the cap includes a flat plate and a second engagement portion to be engaged with the first engagement portion, and wherein an inner surface of the first wall includes a protrusion which protrudes toward the right front wall and the left front wall, wherein when the cap is fitted to the hole, the protrusion of the cap and the protrusion of the first wall press-sandwich the electric connection box.

5. The box according to claim 3, wherein the fifth wall includes a bridge wall which connects the right front wall and the left front wall at the deep side of the insertion direction.

\* \* \* \* \*